United States Patent
Araki

(10) Patent No.: US 9,065,036 B2
(45) Date of Patent: Jun. 23, 2015

(54) VIBRATION-TYPE DRIVING APPARATUS AND IMAGE PICKUP APPARATUS

(71) Applicant: CANON KABUSHIKI KAISHA, Tokyo (JP)

(72) Inventor: Yasuyuki Araki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 197 days.

(21) Appl. No.: 13/772,891

(22) Filed: Feb. 21, 2013

(65) Prior Publication Data

US 2013/0222678 A1 Aug. 29, 2013

(30) Foreign Application Priority Data

Feb. 23, 2012 (JP) .................................. 2012-037435
Feb. 1, 2013 (JP) .................................. 2013-018547

(51) Int. Cl.
| | |
|---|---|
| H01L 41/047 | (2006.01) |
| H02N 2/00 | (2006.01) |
| H04N 5/225 | (2006.01) |
| H02N 2/02 | (2006.01) |

(52) U.S. Cl.
CPC .......... *H01L 41/0475* (2013.01); *H02N 2/0015* (2013.01); *H04N 5/2254* (2013.01); *H02N 2/0085* (2013.01); *H02N 2/026* (2013.01)

(58) Field of Classification Search
CPC ....... H02N 2/026; H02N 2/103; H02N 2/025; H02N 2/004

USPC ......................... 310/323.16, 323.17, 328, 365
See application file for complete search history.

(56) References Cited

U.S. PATENT DOCUMENTS

| | | | | |
|---|---|---|---|---|
| 6,437,485 | B1 * | 8/2002 | Johansson ..................... | 310/332 |
| 7,053,527 | B2 * | 5/2006 | Mattsson et al. .............. | 310/328 |
| 7,242,131 | B2 * | 7/2007 | Kishi et al. .............. | 310/323.02 |
| 2006/0238904 | A1 * | 10/2006 | Nakashima et al. .......... | 359/824 |
| 2009/0026886 | A1 * | 1/2009 | Yoshida et al. ............... | 310/328 |
| 2011/0227453 | A1 * | 9/2011 | Araki et al. .............. | 310/323.02 |

FOREIGN PATENT DOCUMENTS

| | | |
|---|---|---|
| JP | 2004-297949 A | 10/2004 |
| JP | 2004-304887 A | 10/2004 |
| WO | 2005/060015 A1 | 6/2005 |

* cited by examiner

*Primary Examiner* — Derek Rosenau
*Assistant Examiner* — Bryan Gordon
(74) *Attorney, Agent, or Firm* — Canon USA Inc IP Division

(57) ABSTRACT

Provided is a vibration-type driving apparatus comprising a vibrating body including an electro-mechanical energy conversion element and an elastic body to which the electro-mechanical energy conversion element is joined; and a flexible printed board connected to the electro-mechanical energy conversion element, wherein the flexible printed board includes a first region bonded to at least the location of an antinode portion of vibration of the vibrating body and a second region that is adjacent to the first region and that is not bonded to the electro-mechanical energy conversion element; the boundary portion between the first region and the second region is located at a node portion of the vibration of the vibrating body; and a gap is present between the second region and the vibrating body.

18 Claims, 8 Drawing Sheets

MODE-A

MODE-B

VIBRATION-TYPE DRIVING APPARATUS AND IMAGE PICKUP APPARATUS

BACKGROUND OF THE INVENTION

1. Field of the Invention

The present invention relates to a vibration-type driving apparatus such as an ultrasonic motor.

2. Description of the Related Art

A vibration-type driving apparatus (linear ultrasonic motor), as disclosed in Japanese Patent Laid-Open No. 2004-304887, has been proposed in the related art as a linear ultrasonic motor that linearly drives an object.

The principle of driving the foregoing linear ultrasonic motor will be described using FIGS. 4A, 4B-1, and 4B-2.

As shown in the external perspective view of a linear ultrasonic motor 510 in FIG. 4A, the linear ultrasonic motor 510 is constituted by a vibrating body 501, a driven body 506, and a pressing member (not shown) for pressing the vibrating body 501 to the driven body 506.

The vibrating body 501 is constituted by a piezoelectric element 505 serving as an electro-mechanical energy conversion element, a rectangular elastic body 502 joined to one side of the piezoelectric element 505 to form a single unit, and two protrusions 503 and 504 formed on the upper surface of the elastic body 502.

In ultrasonic motors, vibrations in a plurality of desired vibration modes are excited by applying a voltage with a particular frequency to a piezoelectric element, and the vibration modes are overlapped with each other to create a vibration for driving.

For such a vibration, the linear ultrasonic motor 510 in FIG. 4A causes the vibrating body 501 to vibrate in two bending vibration modes shown in FIGS. 4B-1 and 4B-2.

Both of the two bending vibration modes are bending vibration modes in out-of-plane directions of the plate-like vibrating body 501.

One of the vibration modes is a secondary bending vibration mode (Mode-A) in the longitudinal direction of the vibrating body 501, and the other vibration mode is a primary bending vibration mode (Mode-B) in the lateral direction of the vibrating body 501.

The shape of the vibrating body 501 is designed so that the resonance frequencies of the two vibration modes match or are close to each other.

The protrusions 503 and 504 are disposed at the positions of nodes of a vibration in Mode-A or in the vicinity thereof. Since protrusion end faces 503-1 and 504-1 swing with their disposed positions as the fulcrum due to the vibration in Mode-A, they reciprocate in the X-direction.

Furthermore, the protrusions 503 and 504 are disposed at the position of an antinode of a vibration in Mode-B or in the vicinity thereof. The protrusion end faces 503-1 and 504-1 reciprocate in the Z-direction due to the vibration in Mode-B.

By exciting vibrations in the two vibration modes (Mode-A and Mode-B) at the same time and overlapping them so that the phase difference therebetween reach the vicinity of $\pm\pi/2$, the protrusion end faces 503-1 and 504-1 move in an elliptical orbit in the X-Z plane.

This elliptical motion allows the driven body 506 that is in pressure-contact with the vibrating body 501 to be driven in one direction.

In the foregoing related-art vibration-type driving apparatus (linear ultrasonic motor), a known configuration for applying a voltage to the piezoelectric element uses a flexible printed board.

Specifically, the configuration is such that a plurality of electrodes are provided on one side of the piezoelectric element, and a driving signal is applied to the plurality of electrodes from a driving control unit (not shown) via the flexible printed board.

The flexible printed board is bonded to the piezoelectric element with an adhesive.

SUMMARY OF THE INVENTION

FIGS. 5A to 5D show an example of a vibrating body 601 to which a flexible printed board 606 is bonded.

FIG. 5A is a perspective view of the vibrating body 601; FIG. 5B is a side view of the perspective view in FIG. 5A as seen from direction VB; FIG. 5C is a side view seen from direction VC; and FIG. 5D is a back view of the flexible printed board 606 as viewed from the adhesive surface.

The flexible printed board 606 includes a bonded portion 606c bonded to the piezoelectric element 605 and a non-bonded portion 606d extending from an end of the piezoelectric element 605, for connecting to a driving control unit.

A boundary portion 606e between the bonded portion 606c and the non-bonded portion 606d undergoes large vibration displacement while the vibrating body 601 vibrates, as shown in FIG. 5E.

At that time, the flexible printed board 606 vibrates together with the vibrating body 601. This causes force to be transmitted to the piezoelectric element 605 via the flexible printed board 606, which causes an obstruction to the bending vibration in Mode-B of the piezoelectric element 605, thus resulting in a decrease in efficiency.

This influence becomes notable particularly when the amount of the adhesive is large at the boundary portion 606e between the bonded portion 606c and the non-bonded portion 606d to increase the rigidity, weight, etc. of the flexible printed board 606 correspondingly. This causes variations in vibration characteristics between individual vibrating bodies.

In consideration of the above problem, the present invention provides a vibration-type driving apparatus in which a flexible printed board is fixed to an electro-mechanical energy conversion element, and in which the vibration of the vibrating body is less prone to be suppressed, so that variations in vibration characteristics can be reduced.

A vibration-type driving apparatus according to an aspect of the present invention includes a vibrating body including an electro-mechanical energy conversion element and an elastic body to which the electro-mechanical energy conversion element is joined; and a flexible printed board connected to the electro-mechanical energy conversion element, wherein the flexible printed board includes a first region bonded to at least the location of an antinode portion of vibration of the vibrating body and a second region that is adjacent to the first region and that is not bonded to the electro-mechanical energy conversion element; the boundary portion between the first region and the second region is located at a node portion of the vibration of the vibrating body; and a gap is present between the second region and the vibrating body.

According to some embodiments of the present invention, a vibration-type driving apparatus in which a flexible printed board is fixed to an electro-mechanical energy conversion element, and in which the vibration of the vibrating body is less prone to be suppressed, so that variations in vibration characteristics can be reduced can be achieved.

Further features of the present invention will become apparent from the following description of exemplary embodiments with reference to the attached drawings.

BRIEF DESCRIPTION OF THE DRAWINGS

FIG. 4B-2 is a diagram showing another vibration mode excited in the vibrating body.

DESCRIPTION OF THE EMBODIMENTS

A vibration-type driving apparatus according to an embodiment of the present invention includes a vibrating body including a piezoelectric element used as an electro-mechanical energy conversion element and an elastic body on which protrusions are formed; a driven body having contact portions that come in contact with the protrusions of the vibrating body; and a flexible printed board for inputting a driving signal to the piezoelectric element.

An elliptical motion caused by two vibration modes of a first bending vibration mode and a second bending vibration mode in which node lines cross substantially at right angles are excited in the protrusions of the vibrating body by applying voltage to the piezoelectric element.

This causes the driven body that is in contact with the protrusions to move relative thereto. In a vibration-type driving apparatus according to an embodiment of the present invention, the flexible printed board has a fixed portion fixed to the electro-mechanical energy conversion element and a non-fixed portion that is not fixed to the electro-mechanical energy conversion element. The boundary portion between the fixed portion and the non-fixed portion is located at a node portion of vibration of the vibrating body.

This can suppress the vibration of the vibrating body, thereby reducing variations in vibration characteristics.

EMBODIMENTS

First Embodiment

An example of the configuration of a vibrating body of a vibration-type driving apparatus to which an embodiment of the present invention is applied will be described as a first embodiment.

FIGS. 1A to 1D are diagrams showing the configuration of a vibrating body 101 of the vibration-type driving apparatus according to the first embodiment of the present invention, the vibrating body 101 being joined to a flexible printed board 106.

Figure 1A:
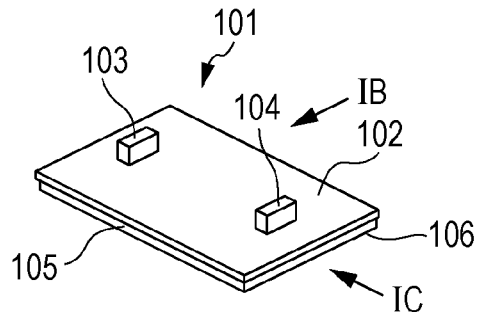
FIG. 1A is a perspective view of a vibrating body according to a first embodiment of the present invention.
Figure 1B:
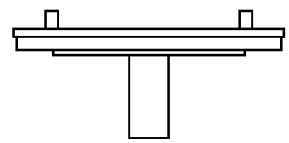
FIG. 1B is a side view of the vibrating body seen from direction IB.
Figure 1C:
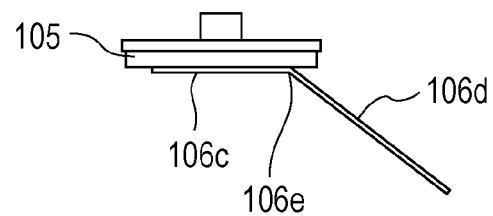
FIG. 1C is a side view of the vibrating body seen from direction IC.
Figure 1D:
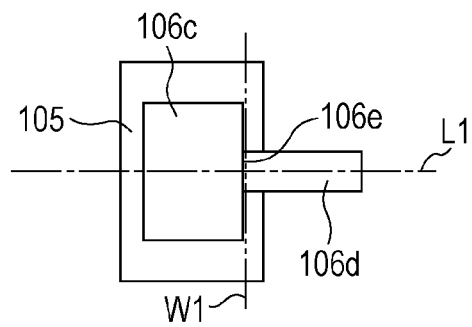
FIG. 1D is a back view of the vibrating body.

FIG. 1A is a perspective view of the vibrating body 101; FIG. 1B is a side view seen from direction IB; FIG. 1C is a side view seen from direction IC; and FIG. 1D is a back view seen from the flexible printed board 106 side. The vibrating body 101 is constituted by a rectangular elastic body 102, a piezoelectric element 105, and two protrusions 103 and 104.

The protrusions 103 and 104 are disposed at the position of nodes of a vibration in the secondary bending vibration mode in the longitudinal direction or in the vicinity thereof on an elastic body 102, and at the position of an antinode of a vibration in the primary bending vibration mode in the lateral direction or in the vicinity thereof.

The material of the elastic body 102 and the two protrusions 103 and 104 is stainless steel.

The piezoelectric element 105 is an electro-mechanical energy conversion element that converts electrical energy (voltage) to mechanical energy (vibration).

The flexible printed board 106 is a conducting component that conducts electricity between the piezoelectric element 105 and a power source (not shown).

The flexible printed board 106 includes a bonded portion 106c bonded to the piezoelectric element 105 and a non-bonded portion 106d.

Bonding of the flexible printed board 106 and the piezoelectric element 105 will be described hereinbelow. Here, the bonding is performed with an adhesive.

A boundary portion 106e between the bonded portion 106c of the flexible printed board 106 to the piezoelectric element 105 and the non-bonded portion 106d is located at the position of a node portion of vibration common to two vibration modes for use in driving. The node portion of vibration refers to a portion closer to a node of vibration than to an antinode of vibration. A node portion of a vibrating body refers to a portion closer to a node of vibration excited in the vibrating body than to an antinode of vibration excited in the vibrating body. Similarly, an antinode portion of vibration refers to a portion closer to an antinode of vibration than to a node of vibration, and an antinode portion of a vibrating body refers to a portion of the vibrating body closer to an antinode of vibration excited in the vibrating body than to a node of vibration.

Figure 6A:
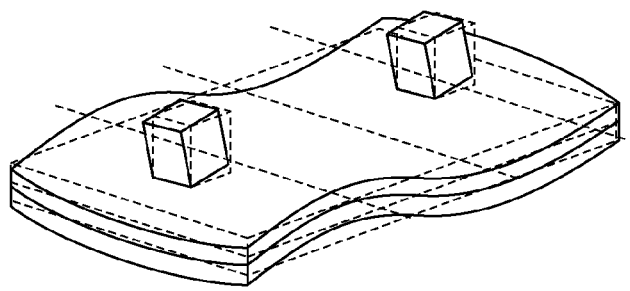
FIG. 6A is a diagram illustrating the relationship between a vibration mode and nodes of vibration.

Here, the relationship between the secondary bending vibration mode in the longitudinal direction and nodes of vibration is shown in FIG. 6A.

In the secondary bending vibration mode, there are three vibration nodes, where little vibration occurs in a line extending perpendicular to the driving direction on the surface of the piezoelectric element.

Figure 6B:
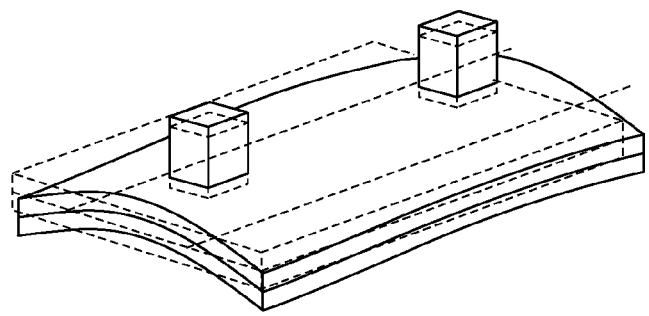
FIG. 6B is a diagram illustrating the relationship between another vibration mode and nodes of vibration.

FIG. 6B shows the positional relationship between the primary bending vibration mode in the lateral direction and nodes of the vibration. In the primary bending vibration mode, there are two vibration nodes, where little vibration occur in a line extending in the driving direction on the surface of the piezoelectric element.

In the first embodiment, as shown in FIG. 1D, the non-bonded portion 106d of the flexible printed board 106 for making conduction with a power source (not shown) extends in the direction perpendicular to the driving direction from a center line L1 between the two protrusions 103 and 104, which is one of the nodes of vibration in the secondary bending vibration mode in the longitudinal direction.

Furthermore, part of the surface of the flexible printed board 106 from the boundary portion 106e between the bonded portion 106c and the non-bonded portion 106d thereof to part of the non-bonded portion 106d is made of an adhesion-resistant material, such as fluoroplastic, so that the non-bonded portion 16e extends from a node portion W1 of vibration in the primary bending vibration mode in the lateral direction.

Thus, even if an adhesive is applied over the entire surface of the piezoelectric element 105 when boned to the flexible printed board 106, this configuration can prevent the flexible printed board 106 from being bonded to an end face of the piezoelectric element 105.

Next, the driving method of the thus-configured vibration-type driving apparatus and operational advantages thereof will be described.

An alternating voltage is applied from a power source (not shown) to the piezoelectric element 105 constituting a vibrating body via an electrode of the flexible printed board 106.

Two out-of-plane bending vibrations are excited in the vibrating body 101 by application of an alternating voltage to cause an elliptical motion on the contact surfaces of the protrusions 103 and 104.

As a result, a driven body that is in pressure-contact with the protrusions 103 and 104 receives a frictional driving force to be driven.

Figure 1E:
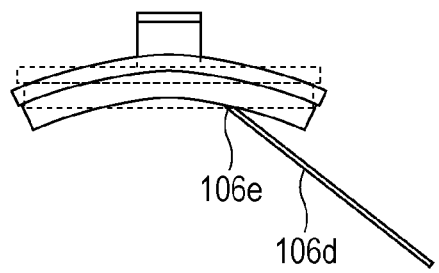
FIG. 1E is a diagram showing the vibration of the vibrating body.
Figure 2A:
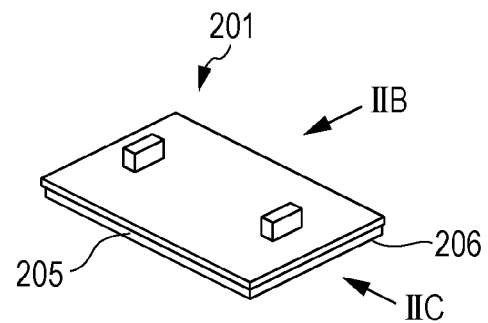
FIG. 2A is a diagram illustrating the configuration of a vibrating body according to a second embodiment of the present invention.
Figure 2B:
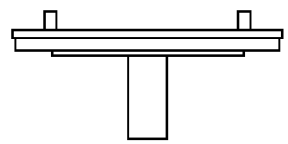
FIG. 2B is a side view of the vibrating body seen from direction IIB.
Figure 2C:
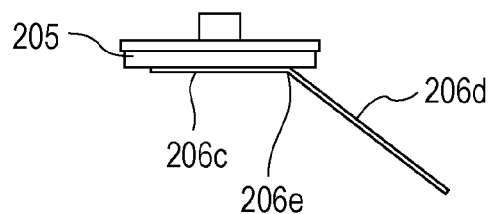
FIG. 2C is a side view of the vibrating body seen from direction IIC.
Figure 2D:
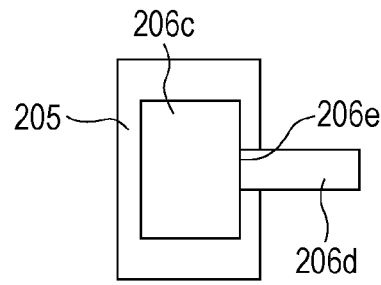
FIG. 2D is a back view of the vibrating body.

The above configuration causes the boundary portion 106e between the bonded portion 106c of the flexible printed board 106 and the non-bonded portion 106d for connecting to the driving control unit to be located at a node portion with little vibration, as shown in FIG. 1E.

As a result, even if the vibrating body 101 vibrates, almost no vibration occurs in the non-bonded portion 106d of the flexible printed board 106, which can reduce the interference of mechanical vibrations due to the flexible printed board 106.

Although the first embodiment is provided with an adhesion-resistant material at part of the flexible printed board 106, another method for providing the same effect without using the adhesion-resistant material on the flexible printed board 106 will be described as follows.

When the flexible printed board 106 is bonded to the piezoelectric element 105, an adhesion-resistant material, such as a Teflon (a registered trademark) sheet, is sandwiched between the flexible printed board 106 and the piezoelectric element 105 from a node portion to an end of the piezoelectric element 105.

By removing the adhesion-resistant material after the adhesive solidifies, the boundary portion between the joint portion of the flexible printed board 106 to the piezoelectric element 105 and the non-joint portion substantially aligns with the node portions of the two bending vibration modes for driving.

This can reduce the interference of mechanical vibrations due to the flexible printed board 106.

Second Embodiment

As a second embodiment, an example of a configuration in which a piezoelectric element and a flexible printed board are joined together with an anisotropic conductive material will be described.

FIGS. 2A to 2D are diagrams showing the configuration of a vibrating body 201 of a vibration-type driving apparatus according to the second embodiment of the present invention, the vibrating body 201 being joined to a flexible printed board 206.

Since the configurations (the elastic body, the piezoelectric element, and the principle of driving by exciting vibrations in two bending vibration modes) other than that the vibrating body 201 and the flexible printed board 206 are joined with the anisotropic conductive material are the same as those of the first embodiment, a description of the duplicated configuration will be omitted.

In the second embodiment, the piezoelectric element 205 and the flexible printed board 206 are joined together with an anisotropic conductive material.

The size of the anisotropic conductive material is adjusted so that a boundary portion 206e between a joint portion 206c of the flexible printed board 206 to the piezoelectric element 205 and a non-joint portion 206d is located at a node portion of vibration common to the two vibration modes for use in driving.

In the second embodiment, the surface of the anisotropic conductive material perpendicular to the conducting direction and the joint portion 206c of the flexible printed board 206 have the same shape and are laid one on top of another.

Using no adhesive can prevent the flexible printed board 206 from being joined to the end of the piezoelectric element 205.

The above configuration can reduce the interference of mechanical vibrations due to the flexible printed board 206.

Third Embodiment

As a third embodiment, an example of a configuration in which the thickness of at least part of the end of a piezoelectric element is smaller than the thickness of part of the piezoelectric element bonded to a flexible printed board will be described.

Figure 3:
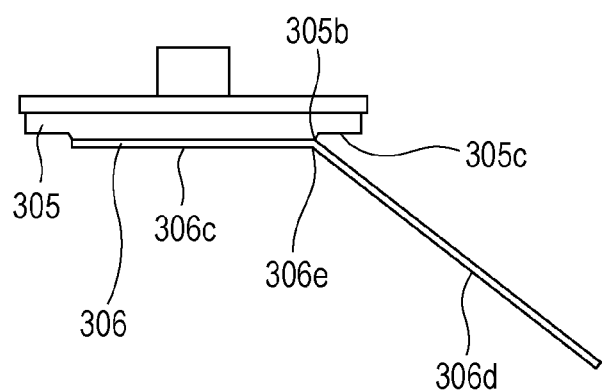
FIG. 3 is a diagram illustrating a vibrating body according to a third embodiment of the present invention.
Figure 4A:
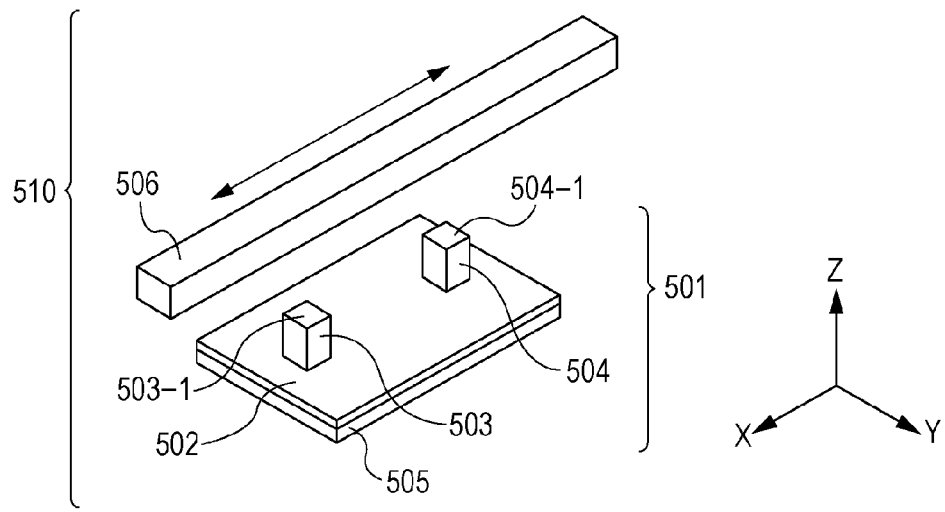
FIG. 4A is an external perspective view of a linear ultrasonic motor disclosed in Japanese Patent Laid-Open No. 2004-304887.
Figures 1, 4B:
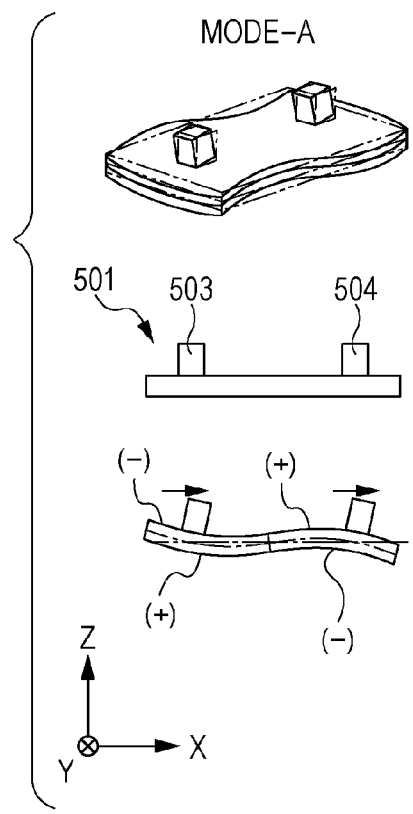
FIG. 4B-1 is a diagram showing a vibration mode excited in the vibrating body.
Figures 2, 4B:
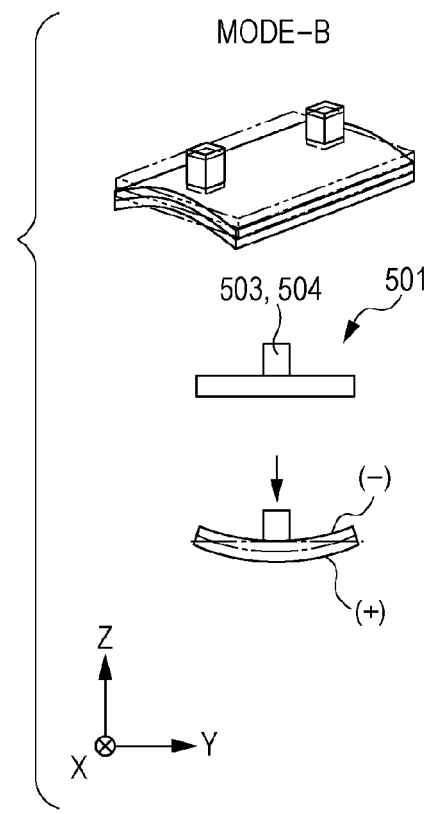
Figure 5A:
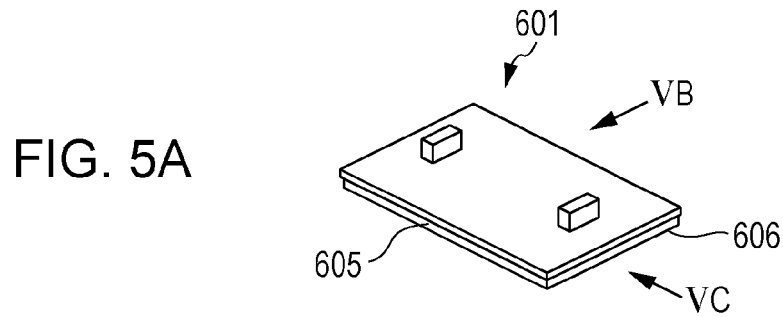
FIG. 5A is a perspective view of a vibrating body to which a flexible printed board is bonded.
Figure 5B:
FIG. 5B is a side view of the perspective view in FIG. 5A as seen from direction VB.
Figure 5C:
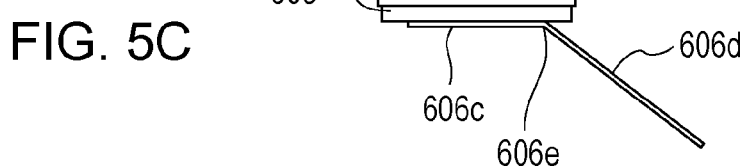
FIG. 5C is a side view of the vibrating seen from direction VC.
Figure 5D:
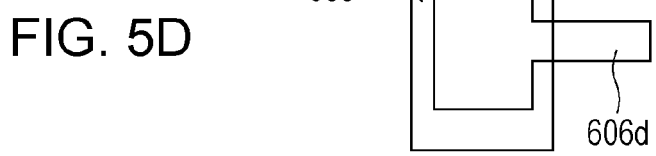
FIG. 5D is a back view of a flexible printed board as viewed from the adhesive surface.
Figure 5E:
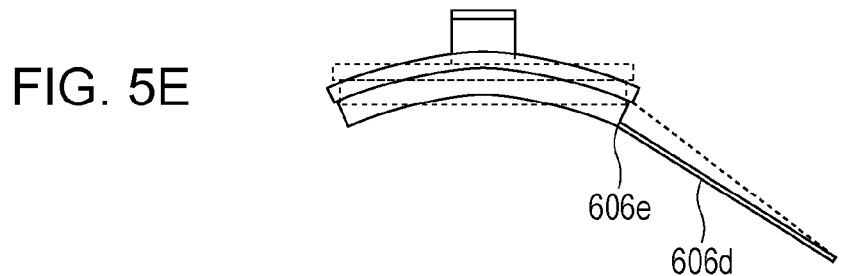
FIG. 5E is a diagram showing the vibration of the vibrating body.

FIG. 3 is a diagram showing the configuration of a vibrating body of a vibration-type driving apparatus according to the third embodiment of the present invention, the vibrating body being joined to a flexible printed board.

Since the configurations (the elastic body, the piezoelectric element, the principle of driving by exciting vibrations in two bending vibration modes) other than that the thickness of at least part of the end of the piezoelectric element is smaller than that of the piezoelectric element bonded to the flexible printed board are the same as those of the first embodiment, a description of the duplicated configuration will be omitted.

In the third embodiment, the thickness of at least part of an end of a piezoelectric element 305 is smaller than that of part of the piezoelectric element 305 bonded to a flexible printed board 306.

In the third embodiment, both ends in the longitudinal direction of the piezoelectric element 305 adjacent to the bonding surface to the flexible printed board 306 each have a stepped portion.

The boundary portion between the stepped portion and a non-stepped portion, that is, an end 305b in the lateral direction of the bonded surface of the piezoelectric element 305 to the flexible printed board 306 is located at the position of a node portion of vibration in the primary bending vibration mode.

Providing the stepped portions at both ends of the piezoelectric element 305 can prevent the flexible printed board 306 from bonding to end faces 305c of the piezoelectric element 305, in which large vibrations occur, when bonded to the flexible printed board 306.

Here, the reason why the piezoelectric element 305 is provided with the stepped portions with the same shape at both ends to form a symmetrical shape is to create a symmetrical vibration.

With the above configuration, a boundary portion 306e between the joint portion 306c of the flexible printed board 306 to the piezoelectric element 305 and the non-joint portion 306d substantially aligns with the node portion of the two bending vibration modes for use in driving.

This can reduce the interference of mechanical vibrations due to the flexible printed board 306.

Fourth Embodiment

As a fourth embodiment, an example of a configuration different from that of the first embodiment will be described.

Figure 7A:
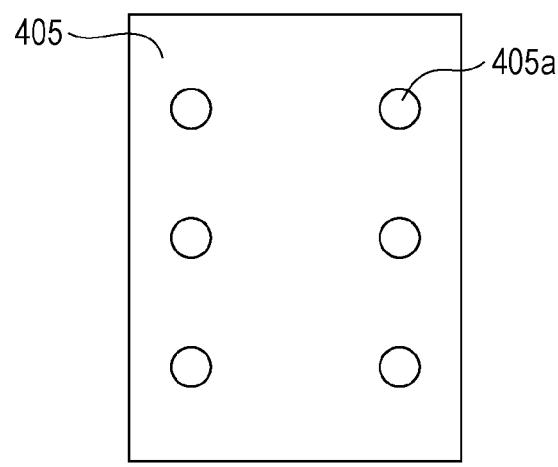
FIG. 7A is a diagram showing the configuration of a vibrating body according to a fourth embodiment of the present invention.
Figure 7B:
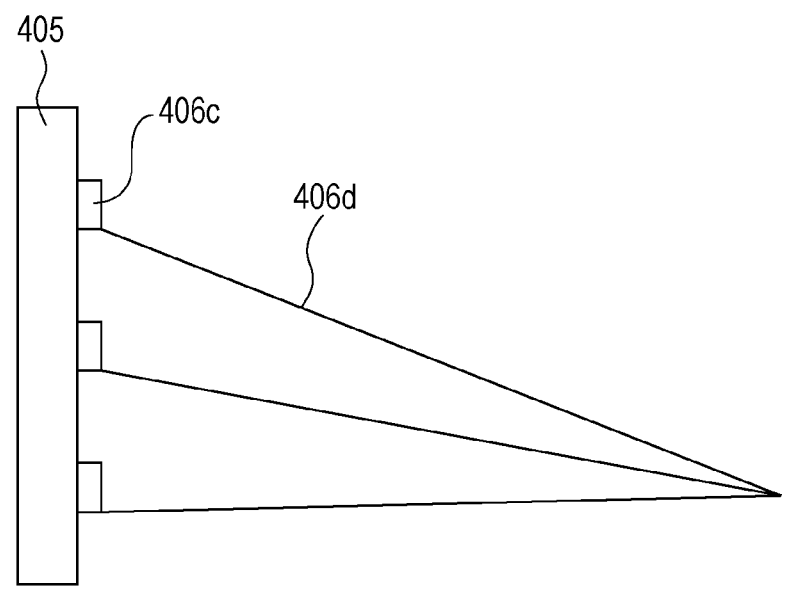
FIG. 7B is a side view of the vibrating body according to the fourth embodiment.

FIGS. 7A and 7B are diagrams showing the configuration of a vibrating body joined to a flexible printed board of a vibration-type driving apparatus according to a fourth embodiment of the present invention.

Since the fourth embodiment is the same as the first embodiment in the configuration of the elastic body, the principle of driving by exciting vibrations in the two bending vibration modes, and so on, configurations different from those of the first embodiment will be described hereinbelow.

In the fourth embodiment, a piezoelectric element 405 has a layered structure in which a large number of thin sheets are layered. The piezoelectric element 405 has, in the layer, through-holes (or via-holes) in which an electrode material is embedded as an interlayer wiring for connecting the plurality of layered internal electrodes.

Ends of the through-holes are exposed from the surface of the piezoelectric element 405 to form protruding surface electrodes 405a, as shown in FIG. 7A.

The surface electrodes 405a of the piezoelectric element 405 are disposed at node potions of vibration in the two vibration modes for use in driving.

As shown in FIG. 7B, a flexible printed board 406 includes branched off portions 406d which are non-bonded portions branching off into a number corresponding to the number of the surface electrodes 405a so as to be bonded to the surface electrodes 405a on a one-by-one basis. The bonded portions 406c of the flexible printed board 406 are arranged so as to cover the surface electrodes 405a of the piezoelectric element 405.

This allows the bonded portions between the flexible printed board and the piezoelectric element 405 to be limited to the node portions of vibration in the two vibration modes.

The above configuration can reduce the amount of an adhesive used, having a damping effect and can reduce the interference of mechanical variations due to the flexible printed board 406.

Fifth Embodiment

As a fifth embodiment, an example of a configuration different from that of the third embodiment will be described.

Figure 8:
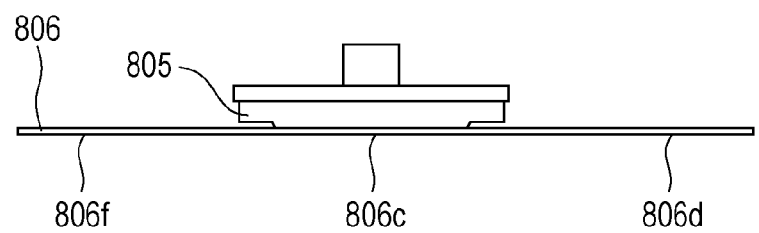
FIG. 8 is a diagram showing the configuration of a vibrating body according to a fifth embodiment of the present invention.

FIG. 8 is a diagram showing the configuration of a vibrating body joined to a flexible printed board of a vibration-type driving apparatus according to a fifth embodiment of the present invention.

Since the fifth embodiment is the same as the third embodiment in the configuration of the elastic body, the principle of driving by exciting vibrations in the two bending vibration modes, and so on, configurations different from those of the third embodiment will be described hereinbelow.

As shown in FIG. 8, the fifth embodiment is configured such that a flexible printed board 806 extends in two directions, from side to side, and one of non-joint portions 806d of the flexible printed board 806 has an electrode, and the other non-joint portion 806f has no electrode.

With this configuration, the vibrating body is symmetrical, which causes a well-balanced variation and allows the vibrating body to be supported by the flexible printed board 806.

At that time, the boundaries between the joint portion 806c of the flexible printed board 806 to the piezoelectric element 805 and the non-joint portions 806d and 806f substantially align with node portions of vibration in the two bending vibration modes.

The above configuration can reduce the interference of mechanical vibrations.

Furthermore, since the vibrating body can be supported by the non-joint portions 806d and 806f of the flexible printed board 806, the need for a component for supporting the vibrating body can be eliminated.

Sixth Embodiment

An example of applications of a vibration-type driving apparatus according to an embodiment of the present invention will be described using an example in which a vibration-type driving apparatus for driving a lens to achieve autofocusing is installed in a lens barrel of an image pickup apparatus (optical equipment), such as a camera, with reference to FIG. 9.

Figure 9:
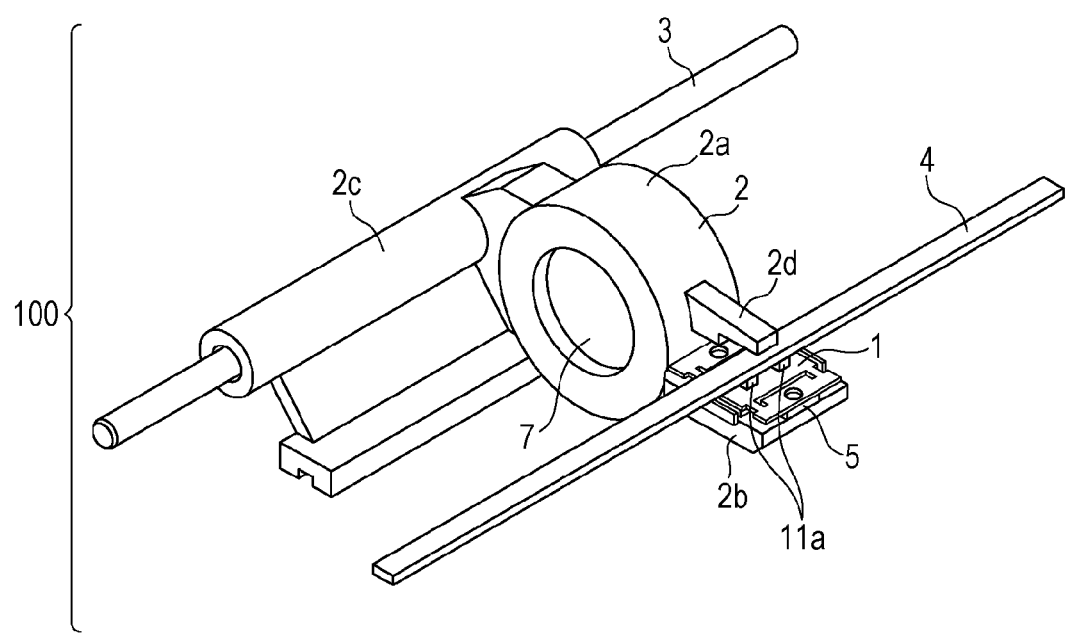
FIG. 9 is a diagram illustrating an example of applications of a vibration-type driving apparatuses according to an embodiment of the present invention.

FIG. 9 is a diagram illustrating a driving mechanism for a lens in a lens barrel. The driven-body driving mechanism using the vibration-type driving apparatus of a sixth embodiment is equipped with a driven body to which a vibrating body including an electro-mechanical energy conversion element to which a flexible board is joined and an elastic body having protrusions are fixed; and a first guide bar and a second guide bar that are disposed parallel to each other and that slidably hold the driven body.

An elliptical motion of the protrusions of the vibrating body, generated due to application of drive voltage to the electro-mechanical energy conversion element, causes a relative moving force between the vibrating body and the second guide bar in contact with the protrusions of the vibrating body. This allows the driven body to move along the first and second guide bars.

Specifically, as shown in FIG. 9, a driving mechanism 100 for a driven body using the vibration-type driving apparatus of this embodiment mainly includes a lens holder 2, a lens 7, a vibrating body 1 to which a flexible board is joined, a pressure magnet 5, two guide bars 3 and 4, and a base (not shown).

The two guide bars, that is, the first guide bar 3 and the second guide bar 4, are fixed such that both ends thereof are retained in parallel by the base (not shown).

The lens holder 2 includes a cylindrical holder portion 2a, a retaining portion 2b that retains the vibrating body 1 and the pressure magnet 5, and a first guide 2c that engages with the first guide bar 3 to function as a guide.

The pressure magnet 5 serving as a pressurizing unit is composed of a permanent magnet and two yokes disposed at both ends of the permanent magnet. The pressure magnet 5 and the guide bar 4 form a magnet circuit therebetween, thus causing an attracting force therebetween. The pressure magnet 5 is disposed with a certain distance from the guide bar 4. The guide bar 4 is disposed in contact with the vibrating body 1. The attracting force applies a pressurizing force between the guide bar 4 and the vibrating body 1.

Two protrusions 11a of the vibrating body 1 come into pressure contact with the second guide bar 4 to form a second guide. The second guide forms a guide mechanism by using the magnetic attracting force. The vibrating body 1 and the guide bar 4 are sometimes separated due to an external force or the like. This is coped with as follows. A drop-off preventing portion 2d provided at the lens holder 2 comes into contact with the guide bar 4 so that the lens holder 2 returns to a desired position.

By applying a desired electrical signal to the vibrating body 1, a driving force is generated between the vibrating body 1 and the guide bar 4, and the driving force drives the lens holder 2.

The vibration-type driving apparatus may be any of the vibration-type driving apparatuses described in the first to fifth embodiments.

Since the use of the vibration-type driving apparatuses in image pickup apparatuses can suppress loss in vibration energy, the image pickup apparatuses can be reduced in power consumption.

Although FIG. 9 shows an example in which a vibration-type driving apparatus according to an embodiment of the present invention is used in an image pickup apparatus, application examples are not limited thereto; it can be used also for driving various types of stages of a microscope or the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-037435, filed Feb. 23, 2012, and No. 2013-018547, filed Feb. 1, 2013, which are hereby incorporated by reference herein in their entirety.

What is claimed is:

1. A vibration-type driving apparatus comprising:
    a vibrating body including an electro-mechanical energy conversion element and an elastic body to which the electro-mechanical energy conversion element is joined; and
    a flexible printed board connected to the electro-mechanical energy conversion element,
    wherein the flexible printed board includes a first region bonded to at least the location of an antinode portion of vibration of the vibrating body and a second region that is adjacent to the first region and that is not bonded to the electro-mechanical energy conversion element; and
    at least a part of a boundary between the first region and the second region is located at a node portion of the vibration of the vibrating body.

2. The vibration-type driving apparatus according to claim 1, wherein the first region is a portion in which the flexible printed board is bonded to the electro-mechanical energy conversion element with an adhesive.

3. The vibration-type driving apparatus according to claim 1, wherein part of a surface of the second region comprises an adhesion-resistant material.

4. The vibration-type driving apparatus according to claim 3, wherein the adhesion-resistant material is fluoroplastic.

5. The vibration-type driving apparatus according to claim 1, wherein the first region is a portion in which the flexible printed board is joined to the electro-mechanical energy conversion element with an anisotropic conductive material.

6. The vibration-type driving apparatus according to claim 1, wherein a thickness of part of an end of the electro-mechanical energy conversion element is smaller than a thickness of a portion of the electro-mechanical energy conversion element to which the flexible printed board is bonded.

7. The vibration-type driving apparatus according to claim 1, wherein
    the electro-mechanical energy conversion element includes a surface electrode provided at a node portion of vibration of the vibrating body; and
    the flexible printed board is bonded to the surface electrode.

8. The vibration-type driving apparatus according to claim 1, wherein
    the flexible printed board has a third region provided at the opposite side of the second region with respect to the first region;
    the third region is not bonded to the vibrating body; and
    the boundary between the first region and the third region is located at another node portion of the vibration of the vibrating body.

9. The vibration-type driving apparatus according to claim 8, wherein the second region or the third region is not provided with an electrode.

10. The vibration-type driving apparatus according to claim 1, wherein the electro-mechanical energy conversion element is rectangular in shape and excites an elliptical motion with vibrations in a plurality of vibration modes.

11. The vibration-type driving apparatus according to claim 10, wherein the plurality of vibration bending modes include a first bending mode and a second bonding mode in which node lines cross substantially at right angles.

12. The vibration-type driving apparatus according to claim 10, wherein the plurality of vibration modes include a first out-of-plane vibration mode and a second out-of-plane vibration mode in which node lines cross substantially at right angles.

13. The vibration-type driving apparatus according to claim 1, wherein a driven body that is in contact with the elastic body is moved relative to the vibrating body.

14. The vibration-type driving apparatus according to claim 1, wherein the vibrating body is excited in vibration by a driving signal input via the flexible board.

15. An image pickup apparatus comprising:
an image pickup device;
a lens; and
the vibration-type driving apparatus according to claim 1 functionally connected to the image pickup device or the lens.

16. The vibration-type driving apparatus according to claim 1,
wherein a gap is present between the second region and the vibrating body.

17. The vibration-type driving apparatus according to claim 1,
wherein the boundary is located at the node portion of the vibration of the vibrating body.

18. The vibration-type driving apparatus according to claim 1,
wherein the first region is electrically connected to a power source though the second region.

\* \* \* \* \*